United States Patent
Yamamoto et al.

(10) Patent No.: US 6,531,917 B2
(45) Date of Patent: Mar. 11, 2003

(54) NON-LINEAR DISTORTION COMPENSATING APPARATUS

(75) Inventors: Katsuya Yamamoto, Chiba (JP); Shigeo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/876,741

(22) Filed: Jun. 7, 2001

(65) Prior Publication Data

US 2002/0021173 A1 Feb. 21, 2002

(30) Foreign Application Priority Data

Jun. 8, 2000 (JP) ........................................ 2000-172335

(51) Int. Cl.⁷ .............................. H03F 1/26; H03F 1/30
(52) U.S. Cl. ........................ 330/149; 330/136; 375/296
(58) Field of Search ................................ 330/149, 136; 375/296, 297; 455/63

(56) References Cited

U.S. PATENT DOCUMENTS

| | | | | |
|---|---|---|---|---|
| 4,554,514 A | * | 11/1985 | Whartenby et al. | 330/149 |
| 5,329,244 A | * | 7/1994 | Fujita et al. | 330/136 |
| 5,936,464 A | * | 8/1999 | Grondahl | 330/10 |

* cited by examiner

*Primary Examiner*—Tuan T. Lam
(74) *Attorney, Agent, or Firm*—Jay H. Maioli

(57) ABSTRACT

When distortion is compensated by a predistorter method, the distortion can satisfactorily be compensated by a simple arrangement performing a limit operation in such a manner that when a generated predistortion signal is held at a value smaller than a first level, this predistortion signal is not added to an input signal and that when a generated predistortion signal is held at a value larger than a second level, which is larger than the first level, this predistortion signal is added to an input signal as a predetermined fixed value.

2 Claims, 7 Drawing Sheets

FIG. 6

| Threshold | Under Threshold | ACPR1 | ACPR1 Improved | ACPR2 | ACPR2 Improved |
|---|---|---|---|---|---|
| – | – | -39.449 | 9.359 | -52.533 | 0.819 |
| r=1.002 | 0.224 (1834/8192) | -39.449 | 9.433 | -52.533 | 0.788 |
| r=1.005 | 0.440 (3605/8192) | -39.449 | 9.434 | -52.533 | 0.806 |
| r=1.010 | 0.504 (4127/8129) | -39.449 | 9.241 | -52.533 | 0.794 |
| r=1.012 | 0.523 (4288/8129) | -39.449 | 9.134 | -52.533 | 0.226 |
| r=1.015 | 0.697 (5709/8129) | -39.449 | 8.819 | -52.533 | -2.718 |
| r=1.020 | 0.755 (6186/8129) | -39.449 | 8.284 | -52.533 | -3.738 |

FIG. 7

| Threshold | Above Threshold | ACPR1 | ACPR1 Improved | ACPR2 | ACPR2 Improved |
|---|---|---|---|---|---|
| – | – | -39.449 | 9.359 | -52.533 | 0.819 |
| r=1.280 | 0.0001 (1/8192) | -39.449 | 9.359 | -52.533 | 0.818 |
| r=1.200 | 0.0005 (4/8192) | -39.449 | 9.368 | -52.533 | 0.807 |
| r=1.150 | 0.003 (22/8129) | -39.449 | 9.382 | -52.533 | 0.655 |
| r=1.100 | 0.007 (63/8129) | -39.449 | 9.814 | -52.533 | 0.076 |
| r=1.050 | 0.047 (386/8129) | -39.449 | 8.955 | -52.533 | -0.840 |

FIG. 8

| Set to L | Set to H | ACPR1 | ACPR1 Improved | ACPR2 | ACPR2 Improved |
|---|---|---|---|---|---|
| – | – | -39.449 | 9.359 | -52.533 | 0.819 |
| 1.01 | 1.20 | -39.449 | 9.249 | -52.533 | 0.787 |
| 1.01 | 1.15 | -39.449 | 9.277 | -52.533 | 0.687 |
| 1.01 | 1.10 | -39.449 | 9.697 | -52.533 | 0.303 |
| 1.005 | 1.15 | -39.449 | 9.450 | -52.533 | 0.690 |
| 1.012 | 1.15 | -39.449 | 9.157 | -52.533 | 0.084 | ns
NON-LINEAR DISTORTION COMPENSATING APPARATUS

BACKGROUND OF THE INVENTION

1. Field of the Invention

The present invention relates to a non-linear distortion compensating apparatus suitable for use in compensating a non-linear distortion generated from an amplifier of a transmitting section of a base station or a terminal station of a wireless communication system, for example.

2. Description of the Related Art

Heretofore, there have been proposed and commercially available several systems as a processing for compensating a non-linear distortion of a transmitting section of a radio communication device. In general, there can be enumerated a negative feedback method, a predistorter method and a feedforward method The negative feedback method is a method in which an output signal from a transmission power amplifier is again fed back and a non-linear distortion is compensated by a negative feedback circuit. To be concrete, there can be enumerated a Cartesian Loop method for analyzing a feedback signal into in-phase and orthogonal components, by way of example. The negative feedback method encounters a problem of a stability of the negative feedback circuit.

The predistorter method is a method in which a predistortion signal component is added to an input signal in order to cancel a distortion generated from the transmission power amplifier. Although the predistorter method is an open loop control and is excellent in stability unlike the negative feedback method, this method encounters a problem in which the predistortion signal component should be adapted depending upon a characteristic parameter of an amplifier.

The feedforward method is a method in which a distortion generated from a transmission power amplifier is detected and this distortion component is amplified and subtracted from an output signal of the transmission power amplifier. Although this method is the open loop control similarly to the predistorter method and is therefore excellent in stability, this method encounters problems of a non-linear property of a power amplifier added in order to compensate a distortion and a power efficiency.

Of the above three non-linear distortion compensating methods, today, the predistorter method receives a remarkable attention from standpoints of stability and power efficiency. According to the previously-proposed predistorter method, a non-linear distortion characteristic is expressed by an amplitude distortion characteristic and a phase distortion characteristic of a transmission signal and these reverse characteristics are stored in a memory means such as a ROM as data to thereby compensate a non-linear distortion.

Specifically, in the conventional predistorter method, a non-linear distortion is analyzed by measuring a non-linear distortion characteristic of a transmission power amplifier and the non-linear distortion is approximated with a high accuracy by approximation polynomial. Then, a highly-accurate approximation expression of a reverse distortion characteristic is generated from this highly-accurate approximation expression, distortion compensating data is generated by the highly-accurate approximation expression of the reverse distortion characteristic and stored in a suitable means such as a ROM, data is read out from a corresponding address of the ROM in response to the input signal level, and the data thus read out is added to the input signal.

FIG. 10 shows an example thereof. An amplitude characteristic G1 of a transmission power amplifier, for example, is assumed to be such one that an inputted electric power and an outputted electric power are linearly changed up to a certain level and are substantially coincident with an ideal amplitude characteristic and that when they exceed a certain level, they become non-linear characteristics. At that time, if the inputted electric power level, for example, is A, then an ideal outputted electric power level presented at that time is B'. In actual practice, without compensation, the outputted level becomes B due to the non-linear property of the amplitude characteristic G1. The outputted electric power level can be corrected to become the ideal outputted electric power level B' without distortion by adding the predistortion signal in such a manner that the input of the amplifier becomes a level A'.

However, according to the above conventional predistorter method, in order to achieve satisfactory distortion compensating effects, highly-accurate distortion compensating data should be stored in a suitable means such as a ROM. Accordingly, there arise problems that a storage capacity of a memory means that should be required to compensate a distortion should be increased and a circuit scale of a distortion compensating circuit should be increased and as a result a cost has come to increase and an electric power necessary for a processing has to increase unavoidably.

SUMMARY OF THE INVENTION

It is an object of the present invention to provide a non-linear distortion compensating apparatus of a simple construction in which distortions can be compensated satisfactorily when distortions are compensated by the predistorter method.

According to the present invention, there is executed a limit operation in such a manner that when a generated predistortion signal is held at a value smaller than a first level, this predistortion signal is not added to an input signal and that when a generated predistortion signal is held at a value larger than a second level which is larger than the first level, this predistortion signal is set to a predetermined fixed value and this fixed value is added to an input signal With the above arrangement, since the predistortion signal may be generated with respect to an input signal which falls within a constant range, and hence data used to generate a predistortion signal within a range in which a limit operation is executed can be removed. Here, a distortion compensating accuracy can be maintained by satisfactorily setting the first level and the second level.

BRIEF DESCRIPTION OF THE DRAWINGS

FIG. 6 is a characteristic diagram showing an example of a distortion compensating simulation according to an embodiment of the present invention (example in which a threshold value of a lower limit is changed);

FIG. 7 is a characteristic diagram showing an example of a distortion compensating simulation according to an embodiment of the present invention (example in which a threshold value of an upper limit is changed);

FIG. 8 is a characteristic diagram showing an example of a distortion compensating simulation according to an embodiment of the present invention (example in which threshold values of a proper lower limit and a proper upper limit are set);

DESCRIPTION OF THE PREFERRED EMBODIMENTS

An embodiment according to the present invention will be described below with reference to FIGS. 1 to 8.

Figure 1:
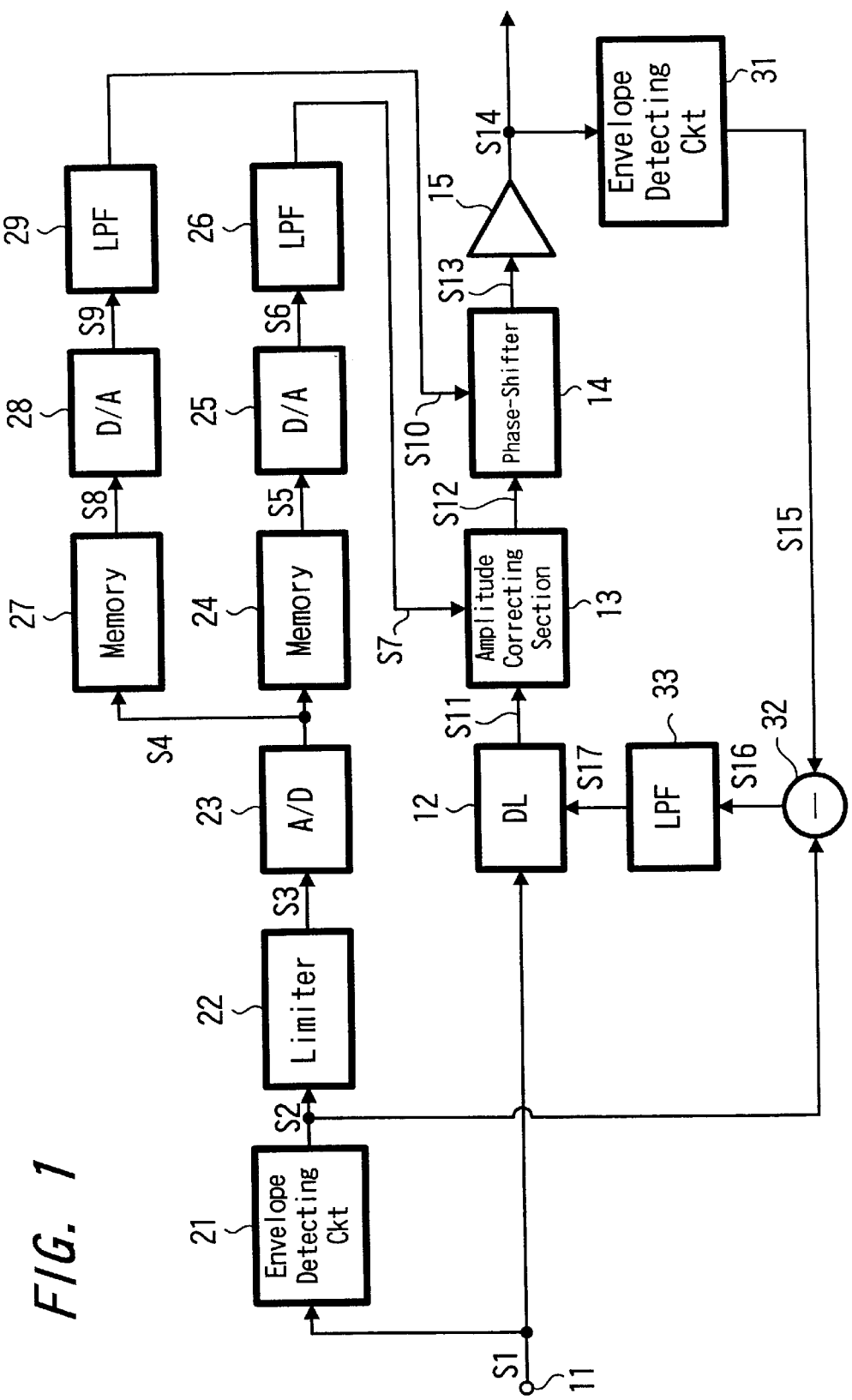
FIG. 1 is a block diagram showing an example of an arrangement of a non-linear distortion compensating apparatus according to an embodiment of the present invention.

In this embodiment, there is provided a distortion correcting apparatus for correcting a non-linear distortion of a transmission power amplifier which is incorporated within a communication apparatus such as a portable telephone terminal or a base station for transmitting a high-frequency wireless signal. FIG. 1 is a diagram showing an arrangement of such distortion correcting apparatus. A transmission signal (high-frequency signal) S1 obtained at an input terminal 11 is supplied to a variable delay element 12, in which it is converted into a signal S11 whose delay amount is controlled by a control signal S17. The transmission signal obtained at the input terminal 11 is a high-frequency signal which was already frequency-converted into a transmission channel. The control signal S17 will be described later on.

The signal S11 outputted from the variable delay element 12 is supplied to an amplitude correcting section 13, in which it is amplitude-corrected by an amplitude distortion correcting predistortion signal S7 and thereby an amplitude corrected signal S12 is obtained. An arrangement for obtaining the amplitude distortion correcting predistortion signal S7 will be described later on. The signal S12 which was amplitude-corrected by the amplitude correcting section 13 is supplied to a phase-shifter 14, in which it is phase-corrected by a phase-correcting predistorition signal S10 and thereby a phase-corrected signal S13 is obtained.

Then, the signal S13 outputted from the phase-shifter 14 is supplied to a transmission power amplifier 15 which then generates a high-frequency signal S14 which is amplified in electric power for transmission. This high-frequency signal S14 is transmitted by radio, for example.

Next, an arrangement for correcting respective signals within the signal channel described so far will be described. The transmission signal S1 obtained at the input terminal S1 is supplied to an envelope detecting circuit 21 which then generates an envelope detecting signal S2 of a high-frequency signal. As the envelope detecting circuit 21, there can be applied a circuit using a diode, for example, as a detecting means. The envelope detecting signal S2 outputted from the envelope detecting circuit 21 is supplied to a limiter 22 which executes a limit operation corresponding to the level of the supplied signal.

As the limit operation executed herein, there are set a first threshold value (threshold value of lower limit) which is used to judge whether or not the level of the signal S2 is a sufficiently small level and a second threshold value (threshold value of upper limit) which is used to judge whether or not the level of the signal S2 is a sufficiently large level. Then, when the level of the supplied signal S2 is lower than the first threshold value, it is limited to 0 level (i.e., data of level in which predistortion operation is not carried out) as the output signal S3. When the level of the supplied signal S2 is higher than the second threshold value, it is limited to a constant fixed level (fixed level of upper limit) as the output signal S3. When the level of the signal S2 falls within a range of from the first threshold value to the second threshold value, the limit operation is not carried out and the signal S2, for example, is used as the output signal S3 as it is.

The signal S3 that has passed through the limiter 22 is supplied to an analog-to-digital converter 23, in which it is converted into digital data S4. The digital data S4 thus converted is supplied to a first memory 24 and a second memory 27. The first memory 24 is a ROM in which there is stored data on an amplitude distortion correcting predistortion signal in advance. An amplitude distortion correcting predistortion signal S5 is read out from the address corresponding to the supplied data S4 and supplied to a digital-to-analog converter 25. This digital-to-analog converter 25 converts the supplied predistortion signal S5 into an analog signal. An analog predistortion signal S6 thus converted is supplied to a low-pass filter 26, in which it is converted into a signal S7 from which a high-band component was removed. This signal S7 is supplied to the amplitude correcting section 13 as an amplitude distortion correcting control signal. The amplitude correcting section 13 amplitude-corrects the signal S11 outputted from the variable delay element 12 based on the control signal S7 thus supplied.

The second memory 27 to which the digital data S4 converted by the analog-to-digital converter 23 is supplied is a ROM in which there is stored data on a phase distortion correcting predistortion signal in advance. A phase distortion correcting predistortion signal S8 is read out from an address corresponding to the supplied data S4 and supplied to a digital-to-analog converter 28. This digital-to-analog converter 28 converts the supplied predistortion signal S8 into an analog signal. An analog predistortion signal S9 thus converted is supplied to a low-pass filter 29, in which it is converted into a signal S10 from which a high band component was eliminated. This signal S10 is supplied to the phase-shifter 14 as a phase distortion correcting control signal. The phase-shifter 14 phase-corrects the signal S12 outputted from the amplitude correcting section 13 based on the supplied control signal S10.

In the case of this embodiment, an output S14 from the transmission power amplifier 15 is supplied to an envelope detecting circuit 31 which then generates an envelope detecting signal S15. This envelope detecting signal S15 is supplied to a subtractor 32. Then, the envelope detecting signal S2 of the high-frequency signal obtained by the envelope detecting circuit 21 is supplied to the subtractor 32 which then generates a difference signal S16 between the two envelope detecting signals S2 and S15. The difference signal S16 thus obtained is supplied to a low-pass filter 33, in which it is processed to become a signal S17. This signal S17 is supplied to the variable delay element 12 as a delay amount control signal.

Figure 2:
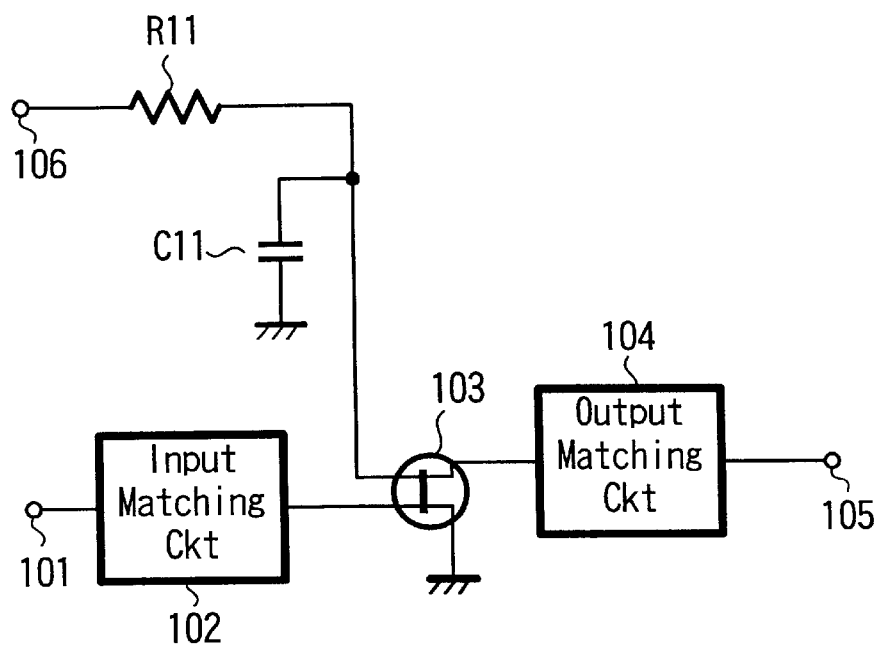
FIG. 2 is a circuit diagram showing an example of an arrangement of an amplitude correcting section.

FIG. 2 shows an example of an arrangement of the amplitude correcting section 13. The amplitude correcting section 13 is a gain varying circuit. In this example, the double-gate FET 103 having a source ground circuit arrangement is used as the amplifying means. An input signal (high-frequency signal) applied to an input terminal 101 is supplied through an input matching circuit 102 to the first gate of a double-gate FET (field-effect transistor) 103. An output from this FET 103 is supplied through an output matching circuit 104 to an output terminal 105. Then, a control signal (amplitude distortion correcting predistortion signal) obtained at a control terminal 106 is supplied through a resistor R11 to the second gate of the double-gate FET 103, and a connection point between this resistor R11 and the FET 103 is connected through a capacitor C11 to the ground.

With the above arrangement, the gain of the signal supplied from the input terminal 101 is controlled by the control signal obtained at the control terminal 106 and thereby supplied to the output terminal 105. Specifically, since the mutual conductance of the double-gate FET depends upon a voltage applied to the second gate, the output gain is adjusted by the control voltage.

Figure 3:
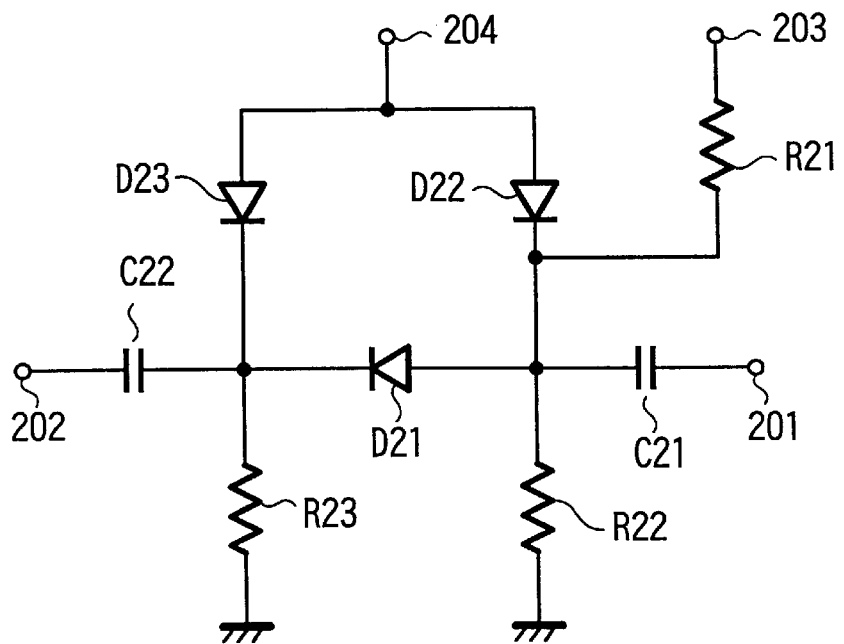
FIG. 3 is a circuit diagram showing another example of an arrangement of an amplitude correcting section.

FIG. 3 shows an example of another arrangement of the amplitude correcting section 13. In this example, there are used three PIN diodes D21, D22, D23. The three PIN diodes D21, D22, D23 constitute a Pi-type attenuating circuit. An input signal (high-frequency signal) applied to an input terminal 201 is connected through a series circuit of a capacitor C21, the PIN diode D21 and a capacitor C22 to an output terminal 202. A predetermined voltage obtained at a bias voltage terminal 204 is supplied through the diode D22 to a connection point between the diode D21 and the capacitor C21 and is also supplied through the diode D23 to a connection point between the diode D21 and the capacitor C22. A connection point between the diode D21 and the capacitor C21 is connected through a resistor R22 to the ground. A connection point between the diode D21 and the capacitor C22 is connected through the resistor R23 to the ground. Then, a control voltage obtained at the control terminal 203 is supplied through the resistor R21 to the connection point between the diode D21 and the capacitor C21.

With the above arrangement, an attenuation degree of the Pi-type attenuating circuit comprised of the three PIN diodes D21, D22, D23 is controlled by the control signal obtained at the control terminal 203 with the result that the output gain is adjusted.

Figure 4:
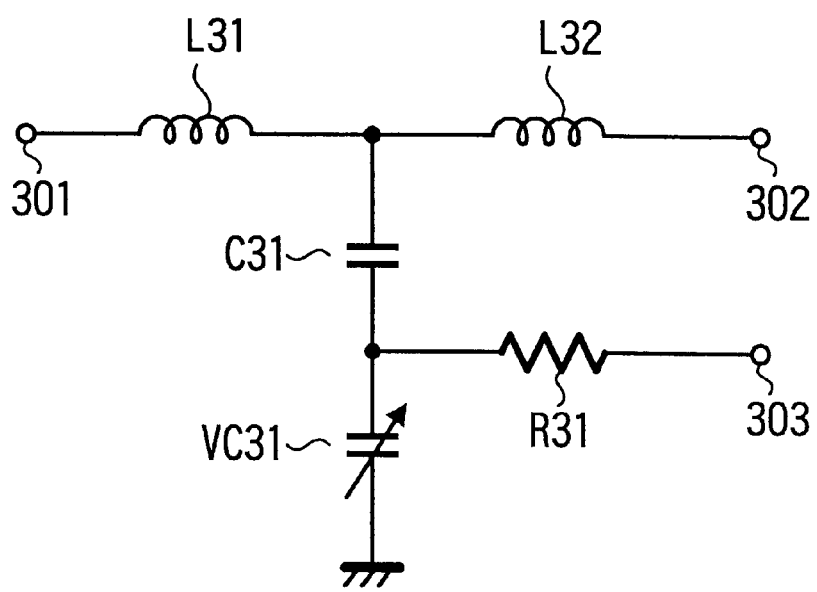
FIG. 4 is a circuit diagram showing an example of an arrangement of a phase-shifter.

FIG. 4 shows an example of an arrangement of the phase-shifter 14. An input signal (high-frequency signal) applied to an input terminal 301 is supplied through a series circuit of coils L1, L2 to an output terminal 302. A capacitor C31 and a variable capacitance element VC31 are connected in series between the connection point between the two coils L1, L2 and the ground potential portion. As the variable capacitance element VC31, there may be used a variable capacitance diode, and the like. Then, a control voltage applied to a control terminal 303 is supplied through a resistor R31 to the connection point between the capacitor C31 and the variable capacitance element VC31.

With the above arrangement, the phase of the high-frequency signal which passes the terminals 301 and 302 is shifted based on the voltage applied to the control terminal 303.

Figure 5:
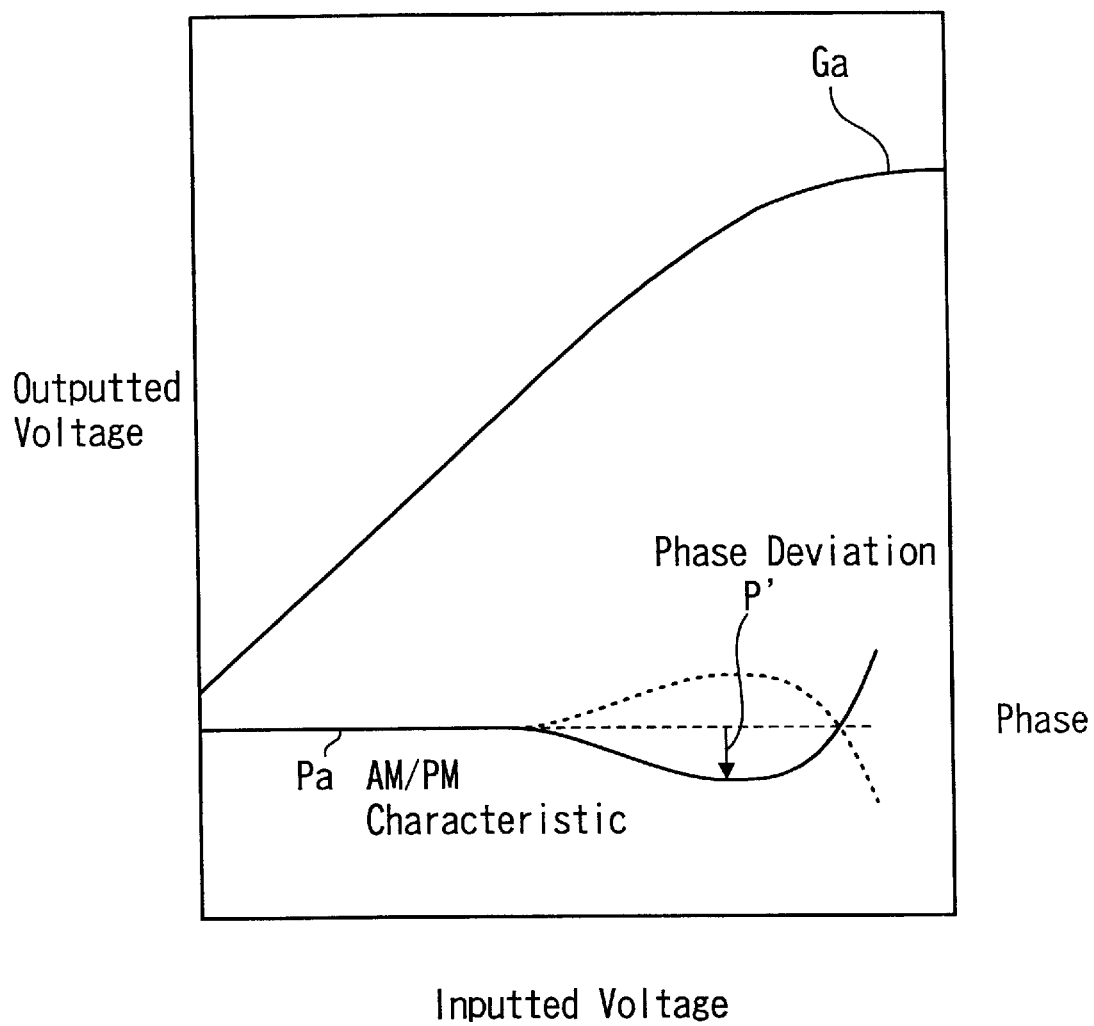
FIG. 5 is a characteristic graph showing a relationship between an inputted voltage and an outputted voltage and examples of phases.

An outline of an example of characteristics obtained when a distortion is compensated by the above distortion compensating apparatus according to this embodiment will be described with reference to FIG. 5. FIG. 5 shows examples of amplitude characteristics and phase characteristics of the input voltage and the output voltage of the transmission power amplifier 15. An amplitude characteristic Ga, for example, demonstrates a non-linear characteristic which does not linearly become proportional to the output voltage when the input voltage exceeds a certain value. The amplitude correcting section 13 corrects this non-linear characteristic.

As a phase characteristic Pa, there is generated a phase shift P'a in which a phase is shifted when the input voltage exceeds a certain value. The phase-shifter 14 shifts the phase by the amount corresponding to this phase shift P' thereby to make the phase value of the input signal and the phase value of the output signal become constant.

Next, simulation results obtained when the distortion is compensated by the distortion compensating apparatus according to this embodiment will be described. In this simulation, 8192 samples of the OPQSK-modulated signal which is used in the digital wireless telephone system in actual practice were made as the input signal and we have simulated results obtained when those signals were compensated in distortion. Here, the distortion compensation amplitude is presented such that a maximum compensation rate is 1.288 times and that a mean compensation rate is 1.015 times.

FIG. 6 shows simulation results of primary and secondary adjacent channel leakage electric power ratio improved amount [dB] of high-frequency signal obtained when the first threshold value (threshold value of lower limit) set by the limiter 22 was changed. ACPR1 represents the primary adjacent channel leakage electric power, ACPR2 represents the secondary adjacent channel leakage electric power and their improved amounts were simulated.

Simulation results of the threshold value of the lower limit (first threshold value) in FIG. 6 will be described. In the distortion compensation, there are a large number of original signals which are slightly compressed from a timebase standpoint. For example, 22.4% of all inputted 8192 samples should be amplitude-corrected by a small amount less than 2% of the original input signal. It can be understood that, although it is an inherent object of the distortion compensation to suppress the electric power leaked to the adjacent channel due to the non-linear distortion of the power amplifier by the distortion compensation, the improvement effect of the adjacent channel electric power leakage ratio based on this distortion compensation also is progressively deteriorated when the added predistortion signal is restricted by the lower limit and the predistortion signal is not added. In particular, it can be understood that, when the threshold value of the lower limit is increased, a bad influence is exerted upon the leakage electric power (ACPR2) of the adjacent channel distant by two channels. However, a study of simulated results of FIG. 6 reveals that, even when the added predistortion signal is restricted by the lower limit and the predistortion signal is not added with respect to about 10% of the input signal, for example, a sufficient distortion compensation effect can be maintained Simulation results of the threshold value of the upper limit (second threshold value) of FIG. 7 will be described. Simulation results were obtained such that the predistortion signal was added as the set upper limit as the fixed value when the added predistortion signal was sufficiently large. In this case, it can be understood that, when the large upper limit value is set, a bad influence is exerted upon the leakage electric power (ACPR2) of the adjacent channel which is distant by two channels. However, it can be understood that, even when the added predistortion signal is restricted by the upper limit with respect to about 20% of the input signal, for example, a sufficiently distortion compensation effect can be maintained. The reason for this is that, there is less inputted data that should be compensated in distortion by the large predistortion signal in actual practice from a timebase standpoint.

FIG. 8 shows simulation results obtained when the predistortion signal was limited by proper upper and lower limits based on the simulation results of FIGS. 6 and 7. In FIG. 8, "SET TO L" represents the lower limit threshold value (first threshold value) set by the limiter 22 and "SET TO H" represents the upper limit threshold value (second threshold value) set by the limiter 22. A study of FIG. 8 reveals that, if proper limit and lower limit threshold values are set, then a satisfactory distortion compensation effect can be maintained.

If the non-linear distortion compensation according to this embodiment is carried out as described above, then the predistortion signal may be generated for only input signals which fall within a constant range passing the limiter 22, and hence data which are required to generate the predistortion signal which falls within a range in which a limit operation is executed by the limiter 22 should not be stored in the memories 24, 27. Accordingly, data of the predistortion signals that should be stored in the memories 24, 27 can be decreased and the arrangement as the compensating apparatus (predistorter) can be simplified. Moreover, as will be clear from the simulation results of FIG. 8, if the first level and the second level which determine the limited range are set satisfactorily and the range in which the distortion compensation accuracy can be maintained satisfactorily is set, distortions can be compensated satisfactorily.

Figure 9:
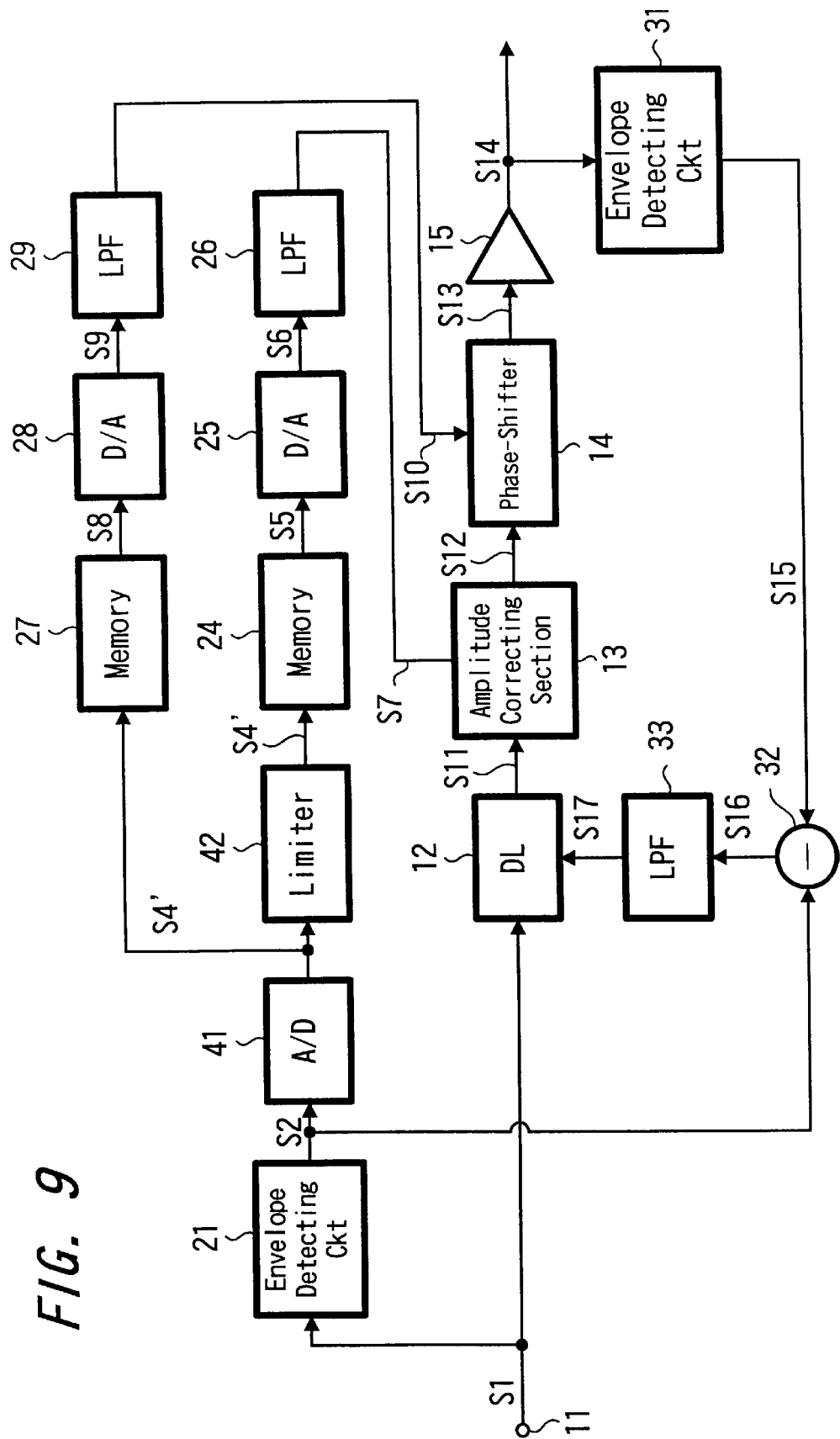
FIG. 9 is a block diagram showing an example of an arrangement of a non-linear distortion compensating apparatus according to another embodiment of the present invention.
Figure 10:
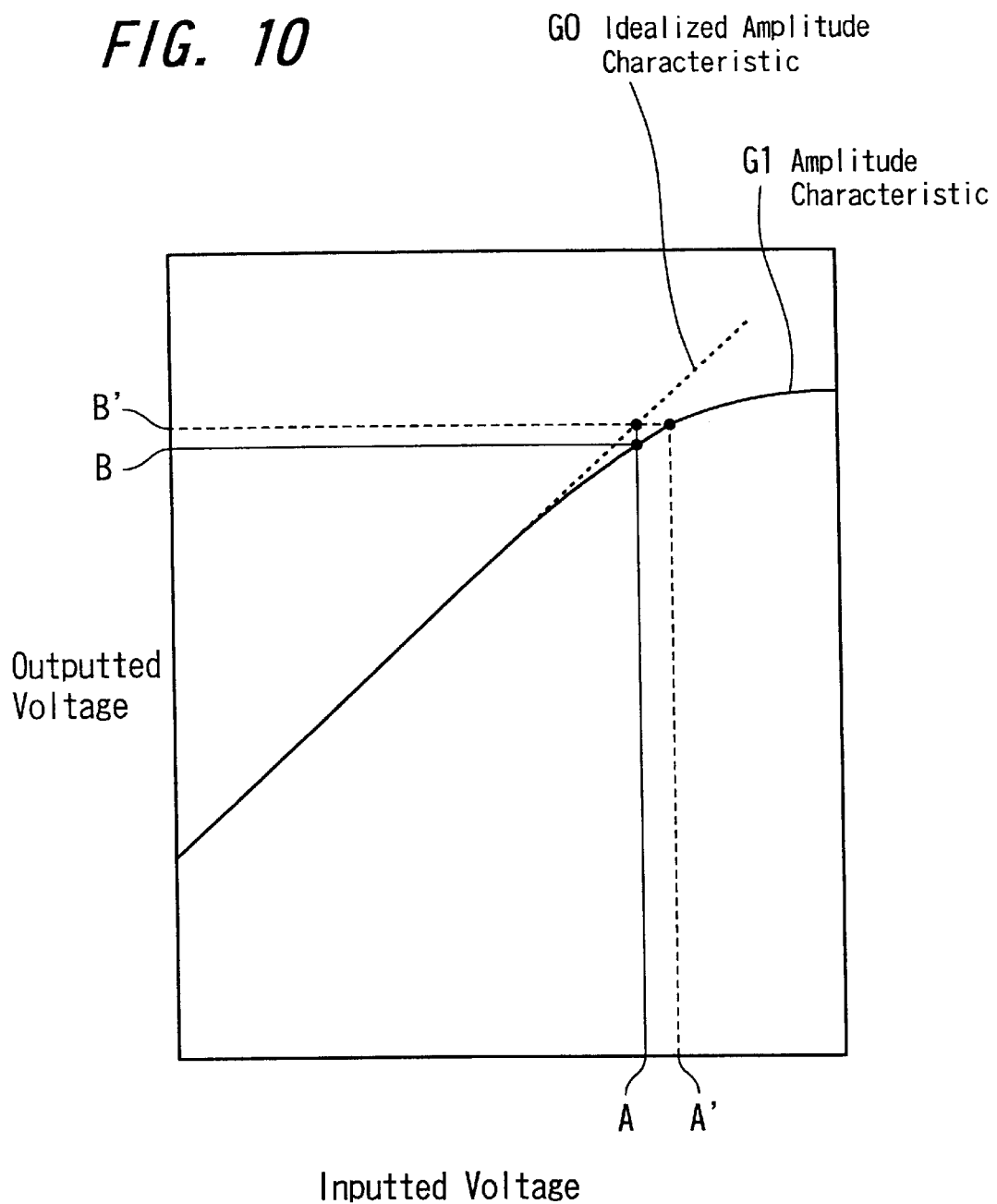
FIG. 10 is a characteristic graph showing an example in which distortions are compensated by a predistorter method.

The distortion compensation operation described in the above embodiment may be effected on the amplitude distortion compensation operation and the phase distortion compensation operation may not be effected as the limit operation. Specifically, as shown in FIG. 9, for example, the envelope detecting signal S2 detected by the envelope detecting signal 21 is supplied to an analog-to-digital converter 41, in which it is converted into digital data S4'. This digital data S4' is directly supplied to a second memory 27 in which data of a phase distortion correcting predistortion signal is stored in advance, and the predistortion signal S8 corresponding to the value of the data S4' is read out from the memory 27.

Further, the data S4' which results from digitally converting the envelope detecting signal S2 detected by the envelope detecting circuit 21 is supplied to the limiter 42 and the limit operation relative to that digital data is carried out. The limit operation herein is the digital limit operation which digitizes the limit operation at the above limiter 22. Specifically, there are set a first threshold value (lower limit threshold value) which is used to judge whether the level of the signal S4' is sufficiently small and a second threshold value (upper limit threshold value) which is used to judge whether the level of the signal S4' is sufficiently large. Data between the first threshold value and the second threshold value is passed.

When the data is under the first threshold value, the data S4' is set to null data, and when the data is above the second threshold value, the above data is fixed to data of a maximum value.

Then, data S4" outputted from this limiter 42 is directly supplied to the first memory 24 in which data of the amplitude distortion correcting predistortion signal is stored in advance, and the predistortion signal S5 corresponding to the value of the data S4" is read out from the memory 24. A rest of FIG. 9 is constructed similarly to that of the distortion compensating apparatus shown in FIG. 1

With the above arrangement, the limit operation required by the predistorter to do the compensation operation is effected only on the amplitude distortion compensating operation and the limit operation is not effected on the phase distortion compensating operation so that the predistortion processing for the phase is constantly executed regardless of the level of the input signal. Accordingly, since the phase distortion of the signal outputted from the transmission power amplifier is constantly corrected with a high accuracy regardless of the level of the signal, when the side which receives this signal, for example, has to detect the phase of the signal, it can constantly detect the phase of the signal with a high accuracy.

In the above embodiment, when the transmission signal is amplified by the high-frequency power amplifier, the predistortion signal is added to the input signal. The present invention is not limited thereto, and can also be applied to the case in which the predistortion signal is added to the input signal when a baseband signal is amplified by an amplifier. In this case, when the level of the input signal of the amplifier, for example, is detected, the envelope signal need not be detected but the limit operation may be carried out when the level of the input signal may be detected directly and the predistortion signal is added to the input signal in response to the detected level.

While the limit operation of the lower limit of the predistortion signal and the limit operation of the upper limit are combined in the above embodiment, the present invention is not limited thereto, and the distortion compensating apparatus which effects only one limit operation may be incorporated into the transmitting apparatus.

According to the present invention, the predistortion signal may be generated for only the input signal which falls within a constant range, and the data which is required to the predistortion signal within the range in which the limit operation is executed becomes unnecessary. Accordingly, if the range in which the distortion compensating accuracy can be maintained satisfactorily is set by satisfactorily setting the first level and the second level, then the range of data that is stored within the predistortion signal generating means for generating the predistortion signal can be suppressed within a constant range, and hence the distortion compensating apparatus of the simple arrangement can be operated satisfactorily as the predistorter. Moreover, since the circuit arrangement can be simplified, the electric power required by the distortion compensation also can be reduced. Furthermore, as a result, the electric power required by the transmission can be reduced. For example, the battery durable time can be increased by applying the transmitting circuit incorporating therein this distortion compensating apparatus to a battery-drive communication apparatus such as a cellular phone terminal and the like.

In this case, since the predistortion signal generating means generates the input signal from the envelope-detected signal and does not execute the limit operation with respect to the phase distortion compensation of the level of the input signal, the phase can constantly be compensated regardless of the level of the input signal. When the side which received this signal, for example, has to detect the phase of the signal, it becomes possible to detect the phase of the signal satisfactorily without error.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A non-linear distortion compensating apparatus for compensating non-linear distortion of an amplifying means, the apparatus comprising:

predistortion signal generating means for generating a predistortion signal for compensating amplitude distortion in response to a level of an input signal of said amplifying means; and amplitude correcting means for using said predistortion signal generated by said predistortion signal generating means to correct an amplitude of said input signal at a preceding stage of said amplifying means, wherein said predistortion signal generating means includes limiter means in which when said amplitude of said input signal is held at a value smaller than a first predetermined level said predistortion signal is not used to correct said amplitude of the input signal by said amplitude correcting means, and when said amplitude of said input signal is held at a value larger than a second predetermined level larger than said first predetermined level said predistortion signal is used to correct the amplitude of the input signal by said amplitude correcting means.

2. The non-linear distortion compensating apparatus according to claim 1, wherein said predistortion signal generating means generates said predistortion signal from an envelope-detected input signal and said limiter means does not execute a limit operation with respect to compensation of a distortion of a phase of said input signal level.

* * * * *